United States Patent
Jayawickrema et al.

(10) Patent No.: US 11,407,179 B2
(45) Date of Patent: Aug. 9, 2022

(54) RECOATER AUTOMATED MONITORING SYSTEMS AND METHODS FOR ADDITIVE MANUFACTURING MACHINES

(71) Applicant: General Electric Company, Schenectady, NY (US)

(72) Inventors: Joanna Mechelle Jayawickrema, Mason, OH (US); Thomas Spears, Springdale, OH (US); Yousef Al-Kofahi, Niskayuna, NY (US); Ali Can, Andover, MA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 661 days.

(21) Appl. No.: 16/359,031

(22) Filed: Mar. 20, 2019

(65) Prior Publication Data

US 2020/0298498 A1    Sep. 24, 2020

(51) Int. Cl.
*B29C 64/393* (2017.01)
*B29C 64/153* (2017.01)
(Continued)

(52) U.S. Cl.
CPC .......... *B29C 64/393* (2017.08); *B29C 64/153* (2017.08); *G06F 30/00* (2020.01); *B33Y 10/00* (2014.12); *B33Y 50/02* (2014.12)

(58) Field of Classification Search
None
See application file for complete search history.

(56) References Cited

U.S. PATENT DOCUMENTS 10,234,848 B2   3/2019   Mehr et al.
2016/0098824 A1   4/2016   Fry et al.
(Continued)

FOREIGN PATENT DOCUMENTS

WO    2018204981 A1    11/2018

OTHER PUBLICATIONS

Foster, Bryant K. et al. "A brief survey of sensing for metal-based powder bed fusion additive manufacturing", Proceedings SPIE 9489, Dimensional Optical Metrology and Inspection for Practical Applications IV, Baltimore, Maryland, May 14, 2015, DOI: 10.1117/12.2180654, 10pgs.

(Continued)

*Primary Examiner* — Sean Shechtman
(74) *Attorney, Agent, or Firm* — Dority & Manning, P.A.

(57) ABSTRACT

A system monitoring an additive manufacturing (AM) machine recoat operation includes an automatic defect recognition subsystem having a predictive model catalog each applicable to a product and to one recoat error indication having a domain dependent feature, the predicative models representative of a recoat error indication appearance at a pixel level of an image captured during recoat operations. The system includes an online monitoring subsystem having an image classifier unit that classifies recoat error indications at the pixel level based on predictive models selected on their metadata, a virtual depiction unit that creates a virtual depiction of an ongoing AM build from successive captured image, and a processor unit to monitor the build for recoat error indications, classify a detected indication, and provide a determination regarding the severity of the detected indication on the ongoing build. A method and a non-transitory computer-readable medium are also disclosed.

12 Claims, 4 Drawing Sheets

(51) Int. Cl.
  *G06F 30/00*    (2020.01)
  *B33Y 10/00*    (2015.01)
  *B33Y 50/02*    (2015.01)

(56)                References Cited

U.S. PATENT DOCUMENTS

2016/0224017 A1*  8/2016  Huang ................. B29C 64/393
2018/0036964 A1   2/2018  Dehghanniri et al.
2018/0079125 A1   3/2018  Perez et al.
2018/0099333 A1   4/2018  Dehghanniri et al.
2018/0104742 A1   4/2018  Kottilingam et al.
2021/0016509 A1*  1/2021  Vora .................... B29C 64/194

OTHER PUBLICATIONS

Nassar, Abdalla R. et al. "Sensing for directed energy deposition and powder bed fusion additive manufacturing at Penn State University", Proceedings SPIE 9738, Laser 3D Manufacturing III, San Francisco, California, Apr. 6, 2016, DOI: 10.1117/12.2217855, 15pgs.

Scime, Luke et al., "Anomaly Detection and Classification in a Laser Powder Bed AM Processing using a Trained Computer Vision Algorithm", NextManufacturing Carnegie Mellon University, Feb. 15, 2017, 1pg.

* cited by examiner

RECOATER AUTOMATED MONITORING SYSTEMS AND METHODS FOR ADDITIVE MANUFACTURING MACHINES

BACKGROUND

Additive manufacturing processes using laser energy to fuse powder bed material builds the part by successive layering of the melted powder. The laser fusing follows a CAD file representing the part itself. For each layer to be built, a new layer of material to be fused is recoated over the prior layer. After the layering is completed, the part can be removed from the surrounding accumulation of powder. During these recoating steps, many errors can occur. Recoating problems that can occur during the layering process can include short feeds, powder clumps, blade lines, drops, and flicks.

Table I is a representative list of recoater error indication types and possible causes.

TABLE I

| Indication Type | Cause |
| --- | --- |
| Recoat - short feeds | Not enough recoat powder. If the powder reservoir is insufficiently packed or powder charge amount is set too low to account for powder consolidation during exposure. Indication: shiny metal surface showing through. |
| Recoat - powder clumps | Partially fused clumps of powder or spatter from the melt pool may stick to the recoater blade introducing linear non-uniformity and troughs across the recoat powder layer. |
| Recoat - blade lines | The recoater blade may be bounce at spiking distorted regions and bounce before settling, leading to non-uniformity in powder thickness. |
| Recoat-drops | Powder accumulates on the recoater arm and at a certain critical mass it falls off onto the build layer during recoat. This can cause severe lack of fusion if it occurs over any fused material. |
| Recoat- flicks | Incidental contact between the recoater blade and certain portions of the build cause flicking of the powder which creates a small divot in the powder bed. |

Conventional approaches provide a limited ability to quantify during the layering process the severity of a recoater error and the error's cumulative effect on a build. Also the art is limited in its ability to evaluate the recoater error effect, and cumulative effect, to determine if the error is benign, tolerable, or fatal to the ongoing build.

DESCRIPTION

Embodying systems and methods provide a recoater automated monitoring system for monitoring additive manufacturing machines to automatically identify recoater error. In some implementations a user can be alerted if the recoater error is significant in magnitude to impact the quality of the build.

Embodying systems and methods provide accurate identification and classification of recoater error indications. These indications can be used by embodiments to determine if an ongoing build is failing (e.g., constructing an out-of-tolerance, or inferior quality, part). Terminating a failing build reduces material loss, generates cost and time savings, and increases additive manufacturing machine production yields and rates.

Figure 1:
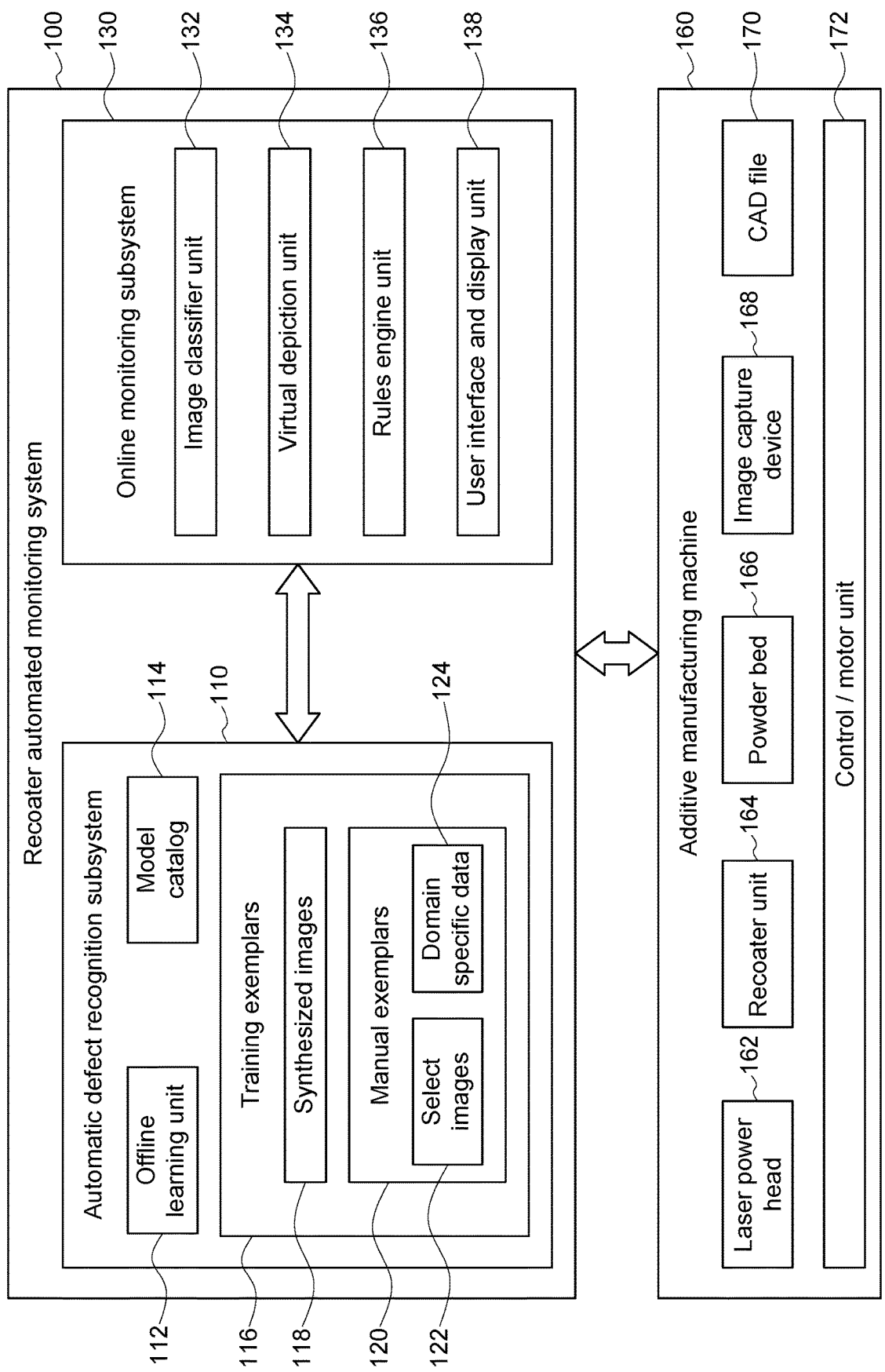
FIG. 1 schematically depicts an recoater automated monitoring system in accordance with embodiments.

FIG. 1 is a schematic of recoater automated monitoring system 100 in accordance with embodiments. Embodying recoater monitoring systems and methods include two interdependent subsystems operating in parallel—automatic defect recognition system 110 and online monitoring system 130.

Automatic defect recognition subsystem (ADR) 110 can include offline learning unit 112. Model catalog 114 includes recoater error indication models representing the appearance of different types of recoater errors. Table I is not an exhaustive list of recoater errors and indications. It should be readily understood that embodying systems and methods are not limited to just the indications presented in Table I.

Different recoater error indication models within model catalog 114 can be optimized for different domains (i.e., machine models) of additive machines, and for different machine units within the same domain. Also, different recoater error indication models can be optimized for different product types being produced by the additive machine. Development of each model is done in a first self-learning phase. After model development, the model can be enhanced in a second phase.

First, a fully automated self-learning phase is performed to build a set of initial recoater error indication models. The first phase can execute in offline learning unit 112 as a fully automated, self-learning process that accesses synthesized images 118 from among training exemplars 116. The synthesized images can be generated from a prior good build with no, or a limited number of, indications.

Second, a semi-automated learning phase is performed, which can be user and/or event driven. In this phase, catalog models can be optimized by supplementing the synthesized image training with manually annotated/labeled examples 120 that includes select images 122 and domain specific data 124. The models are optimized for different parts, product assemblies, additive manufacturing machine domain types and units. Select images 122 can include examples of recoater error indications appearing on other machines, or product builds. Domain specific data 124 can include additive manufacturing machine tolerances, historic wear degradation for a domain, etc.

ADR 110 can create predictive models that, when compared to build images, can recognize recoater defects without need for labeled training sets. The models are based on self-learning that applies synthetically-generated recoater error indications and/or data from successful builds. Each predictive model can represent a recoater error indication as it might appear on a particular production part. In accordance with embodiments, the models can be used by ADR 110 to recognize recoater error indications using a set of predefined features of some other indication types.

In accordance with embodiments, recoater automated monitoring system 100 performance can be improved with feedback. For example, as users determine whether flagged indications are true (i.e., identifying recoater error indications in the captured images), or false, the models can be updated to incorporate the user determinations. In some implementations, the location of an error indication within the build can be used to classify automatically-identified indications. In some implementations, a recoater error can be tolerated (or not) if it occurs outside the structure being manufactured (i.e., support region for production purposes); or within the structure itself and is deemed acceptable for that build. By including in the model classification of indications based on location on the powder bed, false positives can be reduced. This determination of location sensitivity by recoater error can be used by aligning the indications location with a CAD file of the part. Embodiments can measure critical indicators of quality—e.g., indication size, penetrated layers, distance from part edge, etc.

In accordance with implementations, the synthesized image exemplars of recoater error indications can be generated by the following procedure. Given the set of K after exposure images $I_e = \{I_e^1, I_e^2, \ldots, I_e^K\}$ and recoat images $I_r = \{I_r^1, I_r^2, \ldots, I_r^K\}$ as well as the corresponding labeled image $I_l = \{I_l^1, I_l^2, \ldots, I_l^K\}$ showing the part and support regions, which were obtained from a CAD model, we generate a set of K recoat image that include synthetic indications, denoted as $I_d = \{I_d^1, I_d^2, \ldots, I_d^K\}$, and the corresponding labeled images $L_d = \{L_d^1, L_d^2, \ldots, I_d^K\}$ in which the indications are labeled based on their locations (e.g. part, support, powder).

For each labeled image h, randomly extract a set of n points $P_n^i = \{p_1^i, p_2^i, \ldots, p_n^i\}$ (for example, n=9) that are distributed evenly between the part, the support structure and the powder (i.e., for n=9, three points are distributed to each).

Extract M×M square regions from each $I_e^i$ and $I_r^i$ centered at each point extracted in the previous step. For a point $p_j^i$, the two regions are denoted $R_{ij}^e$ and $R_{ij}^r$ respectively. In this work, M is set empirically for each type of indications.

Define a synthetic indication for each extracted region as follows: $d_j^i = w \times R_{ij}^e + (1-w) \times R_{ij}^r + G$, where G is Gaussian noise and w is a weighting factor that is set empirically for each indication type. Define the set of all indication for an image as $D^i = \{d_1^i, d_2^i, \ldots, d_n^i\}$.

Create the synthetic indications image $I_d^i$ by adding the extracted indications to the recoat image $I_r$. More specifically, $I_d^i = I_r^i + D^i$. In addition, create a labeled image of the extracted indications $L_d^i$ where the label of each indication represents its location (part, support, powder) as given in $I_l^i$.

Creating the synthetic indications images is followed by computing a reference recoat image $\overline{I_R}$, which is defined as the pixel-level median of all recoat images in $I_r = \{I_r^1, I_r^2, \ldots, I_r^K\}$.

Then, for each image, the after exposure image $I_e^i$, the synthetic indications image $I_d^i$, and the reference recoat image $\overline{I_R}$ are used to compute a list of pixel-level intensity feature vectors F. The labeled indications image $L_d^i$ is used to create a list of labels Y, such that each pixel is assigned one of two labels {indication, not indication}. Finally, the features (F) and the labels (Y) are used to train a supervised learning algorithm executing in offline learning unit 112, which builds the prediction model.

Additive manufacturing machine 160 is representative of a machine domain. Embodying systems and methods are not limited to this domain of additive manufacturing machines. Laser power head 162 provides a focused laser beam to melt material in powder bed 166 to form an object represented in CAD file 170. The powder material is spread by recoater unit 164. Image capture device 168 obtains an image of the build. Control/motor unit 172 coordinates these operations.

Figure 2:
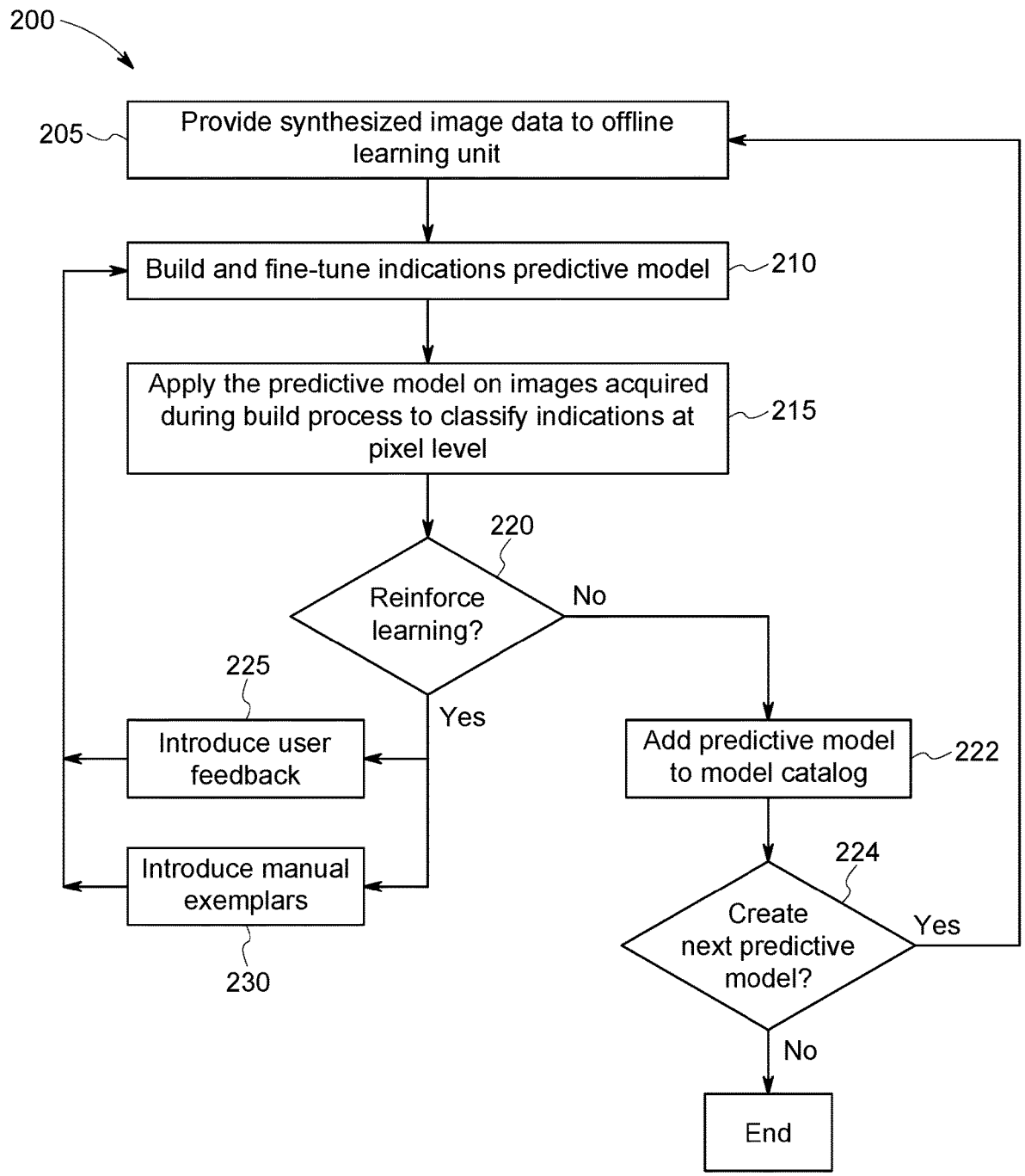
FIG. 2 depicts a process of developing a recoater error indication model in accordance with embodiments.

FIG. 2 depicts process 200 to develop a recoater error indication model in accordance with embodiments. Synthesized image data for recoater error indications are provided, step 205, to offline learning unit 112. An indications predictive model is built, step 210. The predictive model is used to classify pixel-level indications of images acquired during a build process.

The predictive model is applied, step 215, to images acquired during the build process to classify indications at the individual pixel level (i.e., semantic segmentation) of the synthesized image data. Semantics are assigned to individual pixels based on probabilities of the class to which the pixel-level image is most likely to belong by comparing the pixel-level image to a starter model.

Based on a determination to reinforce the self-learning, step 220, process 200 can continue to steps 225 and/or 230, where user feedback can be introduced (step 225), manually annotated/labeled examples 120 can be introduced (step 230), or both can be introduced.

User feedback can include a value representing the user's subjective evaluation of the classification generated by the predictive model. For example, a user can indicate a satisfactory or unsatisfactory classification; an accept or reject; a numeric value representing agreement with the classification (e.g., "1" strongly agree; "10" strongly disagree); or other indication. It should be readily understood that the numeric value representation is not limited to any particular scale or representation; for example a "1" can represent a strong disagreement.

After introduction of user feedback and/or manually annotated/labeled examples, process 200 returns to step 210 to fine-tune the predictive model. This fine tuning can incorporate the feedback to the semantic segmentation classification. If at step 220, a determination is made not to reinforce the self-learning process, the predictive model is added, step 222, to model catalog 114. Based on a determination that another predictive model is to be created, step 224, process 200 returns to step 205. If no more predictive models are to be created, process 200 ends.

In some implementations, predictive models can be trained for subregions of the powder bed. The placement of the imaging device in relation to different positions of the powder bed can change the captured image due to off-axis imaging, image device field- or depth-of view, lighting conditions, perspective distortions, laser direction-of-travel, and other factors. These non-recoater artifacts in the image can lead to inaccurate determination. Selection of predictive models for particular subregions can be based on metadata associated with the image.

Returning to FIG. 1, the second subsystem working in parallel with ADR 110 is online monitoring system 130, which can automatically identify recoater errors by applying the predictive models developed by the ADR and stored in model catalog 114. The online monitoring system runs in parallel with the ongoing continuous learning operations of ADR 110, which improves the predictive models with input from the online monitoring system. In accordance with embodiments, when a recoater error is identified, a user can be alerted if a determination is made that the error can have significant impact on the quality of the build. In some implementations, certain recoater error indications can be analyzed by system 130 to make this impact determination. The online monitoring system can be trained (e.g., initialized and/or configured) prior to use by providing exemplars of the production build from the particular domain unit being monitored. The training can include computing a reference recoat image $\overline{I_R}$ as explained above, and computing an Affine transformation from an after exposure image $I_e^i$ containing the part, which is selected by the user, to the corresponding after exposure image from the reference machine.

Figure 3:
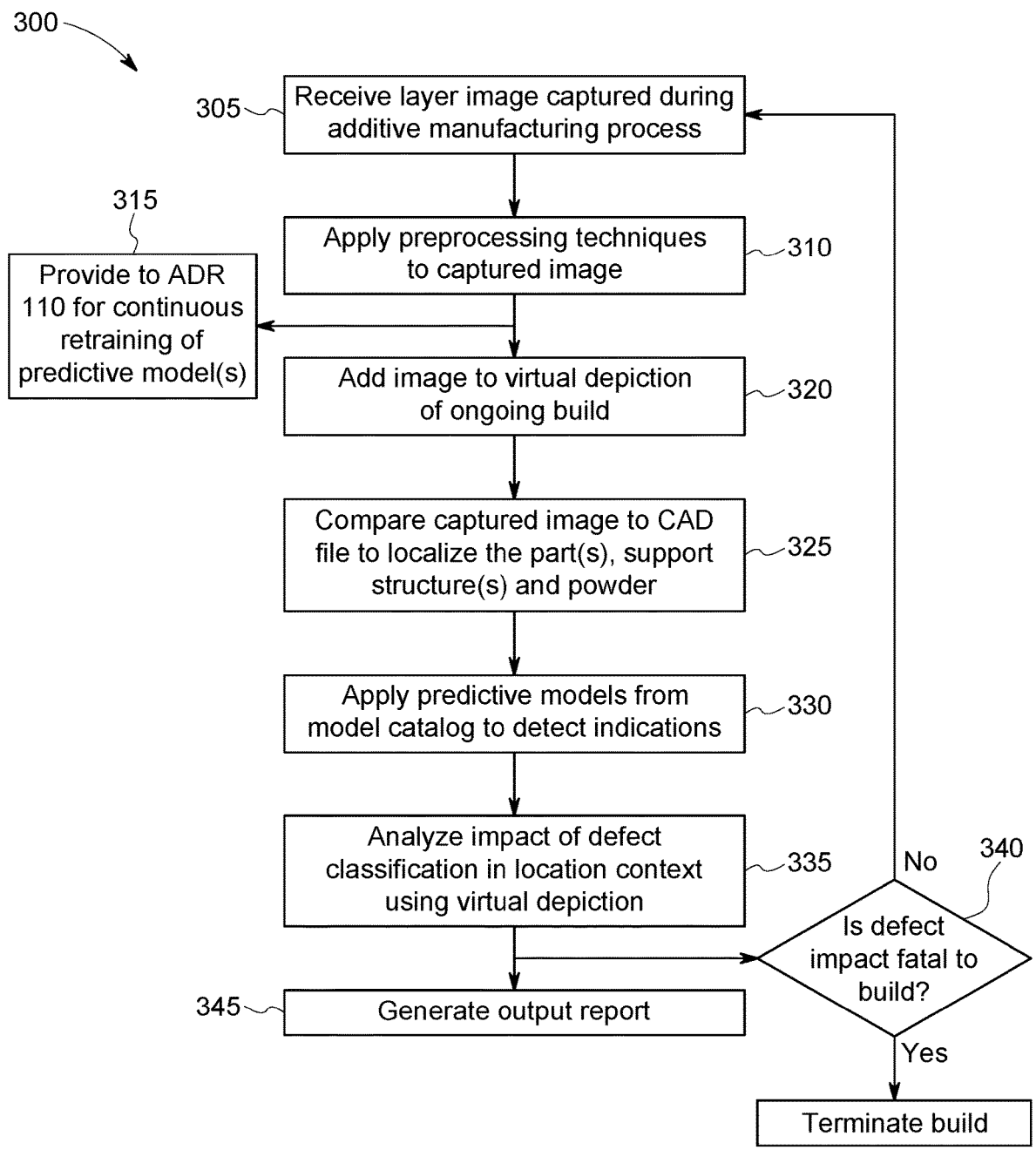
FIG. 3 depicts a process of automated recoater monitoring in accordance with embodiments.

FIG. 3 depicts process 300 of automated recoater monitoring in accordance with embodiments. A recoat layer image is received, step 305. The image is captured by image capture device 168 during an additive manufacturing process. A new image can result in generating both an after exposure image $I_e^i$, and a recoat image $I_r^i$.

Preprocessing techniques are applied, step 310, to these two images. Preprocessing can include applying the Affine transformation computed in the initialization/configuration, normalizing image intensities using a reference recoat image, assigning labels to the pixels using the labeled image obtained from the reference machine, and registering image coordinates to coordinates in a CAD file for the part.

In some implementations, these images can be provided to ADR 110, step 315, for use in the training of the predictive models. Each captured image can be added, step 320, to a virtual depiction of the build is created by virtual depiction unit 134. The virtual depiction is a representation of the build as it is ongoing. Analysis of the virtual depiction can provide information of the number of layers penetrated by a recoater error, its three-dimensional location relative to portions of the build item.

The captured image is compared, step 325, to the CAD file slice representative of the particular layer being evaluated to localize the part(s), support structure(s) and powder. The indications predictive model is applied, step 330, to the captured image and the localized information to identify the location of each indication (if any).

In some implementations, pixels can be classified with a binary label (e.g., indication=1, no indication=0). Indications outside of the powder bed are excluded. The impact of the defect classification-labeled pixels are analyzed, step 335, in its location context using the virtual depiction to determine the defect's impact. Action is taken based on a catalog of predefined rules that are applied to the virtual depiction. The rules can specify the quantity, size and penetration of indications dependent on the part being built.

If a determination is made that the defect is fatal to the part production, step 340, the build is terminated. The termination determination can be made with input from a user, or by following a decision-tree applied algorithmically.

An output report containing information on the results of the build monitoring (fatal or not) is generated, step 345. This output can include an indication map showing locations of indications, and extent of penetration. The output report can be in tabular format containing a unique identifier for each detected defect, its indication type, position (x, y), penetrated layer count, area ($mm^2$) and/or volume ($mm^3$). The output report can provide the defect location on the powder bed relative to the CAD file (i.e., a portion of the part, or extraneous to the part), and its distance to the part boundary. These factors can be used in manually evaluating the severity of the cumulative defects.

Figure 4:
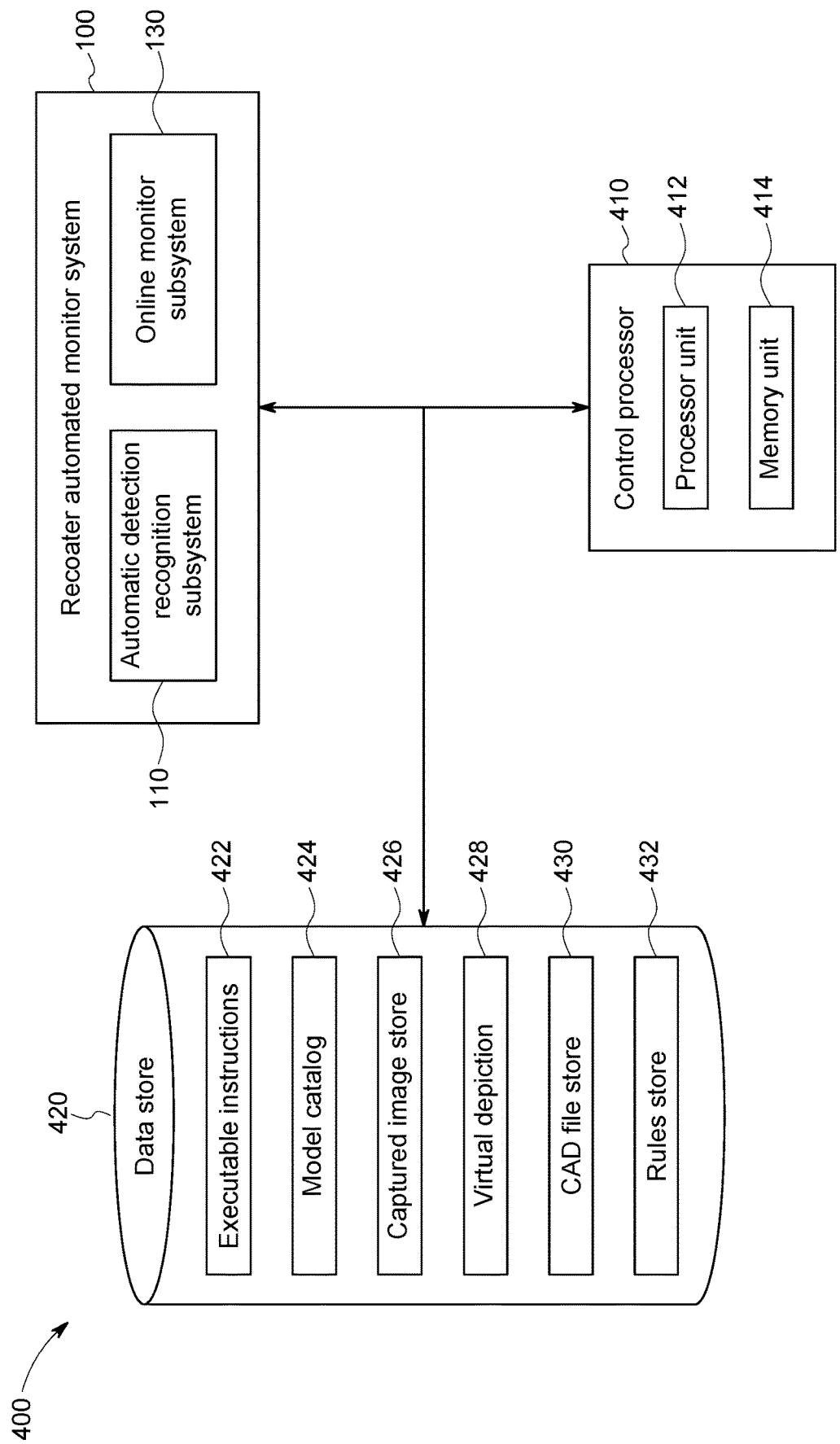
FIG. 4 depicts a system for implementing an recoater automated monitoring system in accordance with embodiments.

FIG. 4 illustrates system 400 for implementing recoater automated monitoring system 100 in accordance with embodiments. Control processor 410 can include processor unit 412 and memory unit 414. The control processor can be in communication with elements of system 100 across local control/data networks and/or electronic communication networks, as needed. Processor unit 412 can execute executable instructions 422, which cause the processor to perform the querying of federated data stores in accordance with embodiments as disclosed above. Memory unit 414 can provide the control processor with local cache memory. Data store 420 can include model catalog 424, captured image store 426, virtual depiction 428, CAD file store 430, and rules store 434 to support operation of the recoater monitoring system as disclosed above.

Embodying systems and methods provide classification of recoater error indications with high accuracy and low positive rates. Accurate identification and classification of recoater error indications can result in decisions to terminate a build when it fails (e.g. poor quality parts), rather than during a post-production part inspection. Thus, reducing material loss and increasing production throughput, which results in cost and time savings. Automated detection and monitoring implemented by embodying systems and methods is quantitative, resulting in greater accuracy and repeatability compared to relying on a human operator's intervention.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable program instructions that when executed may instruct and/or cause a controller or processor to perform methods discussed herein such as a method of providing accurate identification and classification of recoat error indications, as disclosed above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A system for monitoring a recoat in an additive manufacturing machine, the system comprising:
   an automatic defect recognition subsystem including:
      a model catalog of a plurality of predictive models, each of the plurality of predictive model applicable to one of a plurality of products and to one of a plurality of recoat error indications, the plurality of recoat error indications having a domain dependent feature, each of the plurality of predictive models representative of recoat error indications at a pixel level of an image captured during recoat operations on the additive manufacturing machine; and
   an online monitoring subsystem including:
      an image classifier unit configured to classify the recoat error indications at the pixel level based on one of a selection of the plurality of predictive models, the plurality of predictive models selected based on metadata of the plurality of predictive models;
      a virtual depiction unit creating a virtual depiction of an ongoing build from successive captured images; and a processor unit configured to execute executable instructions that cause the processor unit to perform a method of monitoring an ongoing additive manufacturing build for the recoat error indications, classifying a detected indication of the recoat error indications into a defect classification, and providing a determination regarding a severity of the detected indication to the ongoing additive manufacturing build, the executable instructions causing the processor unit to perform the method including:

building a set of initial recoat indication models into a model set in an offline learning unit configured to implement self-learning techniques to process synthesized images of the recoat error indications;

optimizing the model set by supplementing the model set with manually annotated/labeled examples; and storing the model set as the plurality of predictive models in the model catalog, each of the plurality of predictive models representing a particular type of the recoating error indications as it might appear on a particular additive manufacturing machine domain when producing a particular part.

2. The system of claim 1, the manually annotated/labeled examples including select images of known recoat error indications selected by a user or domain specific data provided by a user.

3. The system of claim 1, the executable instructions causing the processor unit to perform the method including applying semantic segmentation at a pixel level of the synthesized images to classify a recoat error indication represented in the synthesized images.

4. The system of claim 1, the executable instructions causing the processor unit to perform the method including:

receiving a layer image captured during the ongoing build;

adding the image to the virtual depiction;

comparing the layer image to a CAD file in a CAD file comparison to identify a build portion from a support structure and a powder;

predicting a pixel level binary label for a detected indication;

identifying a location of the detected indication by applying the CAD file comparison to the layer image; and analyzing an impact of the defect classification in context of its location using the virtual depiction.

5. A method of monitoring a recoat in an additive manufacturing machine, the method comprising:

creating a model catalog of a plurality of predictive models, each of the plurality of predictive models applicable to one of a plurality of products and to one of a plurality of recoat error indications, the plurality of recoat error indications having a domain dependent feature;

representing in each of the plurality of predicative models recoat error indications at a pixel level of an image captured during recoat operations on the additive manufacturing machine;

classifying, at the pixel level, recoat error indications based on one of a selection of the plurality of predictive models into a defect classification, the plurality of predictive models selected based on metadata of the plurality of predictive models;

creating a virtual depiction of an ongoing build from successive captured images;

building a set of initial recoat indication models into a model set in an offline learning unit configured to implement self-learning techniques to process synthesized images of the recoat error indications;

optimizing the model set by supplementing the model set with manually annotated/labeled examples; and storing the model set as the plurality of predictive models in the model catalog, each of the plurality of predictive models representing a particular type of the recoating error indications as it might appear on a particular additive manufacturing machine domain when producing a particular part.

6. The method of claim 5, the manually annotated/labeled examples including select images of known recoat error indications selected by a user or domain specific data provided by a user.

7. The method of claim 5, including applying semantic segmentation at a pixel level of the synthesized images to classify a recoat error indication represented in one of the synthesized images.

8. The method of claim 5, including:

receiving a layer image captured during the ongoing build;

adding the image to the virtual depiction;

comparing the layer image to a CAD file in a CAD file comparison to identify a build portion from a support structure and a powder;

predicting a pixel level binary label for a detected indication;

identifying a location of the detected indication by applying the CAD file comparison to the layer image; and analyzing an impact of the defect classification in context of its location using the virtual depiction.

9. A non-transitory computer-readable medium having stored thereon executable instructions when executed by a processor unit cause the processor unit to perform a method of monitoring a recoat in an additive manufacturing machine, the method comprising:

creating a model catalog of a plurality of predictive models, each of the plurality of predictive models applicable to one of a plurality of products and to one of a plurality of recoat error indications, the plurality of recoat error indications having a domain dependent feature;

representing in each of the plurality of predicative models recoat error indications at a pixel level of an image captured during recoat operations on the additive manufacturing machine;

classifying, at the pixel level, recoat error indications based on one of a selection of the plurality of predictive models into a defect classification, the plurality of predictive models selected based on metadata of the plurality of predictive models;

creating a virtual depiction of an ongoing build from successive captured images;

building a set of initial recoat indication models into a model set in an offline learning unit configured to implement self-learning techniques to process synthesized images of the recoat error indications;

optimizing the model set by supplementing the model set with manually annotated/labeled examples; and storing the model set as the plurality of predictive models in the model catalog, each of the plurality of predictive models representing a particular type of recoating error indication as it might appear on a particular additive manufacturing machine domain when producing a particular part.

10. The non-transitory computer-readable medium of claim 9, the executable instructions further configured to cause the processor unit to perform the method, the manually annotated/labeled examples including select images of known recoat error indications selected by a user or domain specific data provided by a user.

11. The non-transitory computer-readable medium of claim 9, the executable instructions further configured to cause the processor unit to perform the method, including applying semantic segmentation at a pixel-level of the synthesized images to classify a recoat error indication represented in the synthesized images.

12. The non-transitory computer-readable medium of claim 9, the executable instructions further configured to cause the processor unit to perform the method, including:
- receiving a layer image captured during the ongoing build;
- adding the image to the virtual depiction;
- comparing the layer image to a CAD file in a CAD file comparison to identify a build portion from a support structure and a powder;
- predicting a pixel level binary label for a detected indication;
- identifying a location of the detected indication by applying the CAD file comparison to the layer image; and
- analyzing an impact of the defect classification in context of its location using the virtual depiction.

* * * * *